US012720028B2

(12) United States Patent
Kempf

(10) Patent No.: US 12,720,028 B2
(45) Date of Patent: Aug. 25, 2026

(54) OPTICAL DIAMOND PASSBAND FILTER

(71) Applicant: Texas Instruments Incorporated, Dallas, TX (US)

(72) Inventor: Jeffrey Kempf, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/811,273

(22) Filed: Aug. 21, 2024

(65) Prior Publication Data

US 2025/0106368 A1 Mar. 27, 2025

Related U.S. Application Data

(60) Provisional application No. 63/584,932, filed on Sep. 25, 2023.

(51) Int. Cl.
*H04N 9/31* (2006.01)
*H03H 17/06* (2006.01)

(52) U.S. Cl.
CPC .......... *H04N 9/3188* (2013.01); *H03H 17/06* (2013.01); *H04N 9/3102* (2013.01)

(58) Field of Classification Search
CPC ..... H04N 9/3188; H04N 9/3102; H03H 17/06
See application file for complete search history.

(56) References Cited

U.S. PATENT DOCUMENTS

2005/0225571 A1* 10/2005 Collins .................. G09G 5/391 345/660
2021/0356744 A1* 11/2021 Kempf ................... G09G 3/007

OTHER PUBLICATIONS

"DLP3030-Q1 0.3-Inch WVGA DMD for Automotive Interior Display," Texas Instruments, DLPS076B—Nov. 2017—Revised Jun. 2019. 41 pages.
"DLP4500 0.45 WXGA DMD," Texas Instruments, DLPS151B—Jan. 2019—Revised May 2022. 56 pages.
Lee, Benjamin, "Introduction to ±12 Degree Orthogonal Digital Micromirror Devices (DMDs)," Texas Instruments, Chapte 1, DLPA008B—Jul. 2008—Revised Feb. 2018. 13 pages.
"Geometric Optics for DLP®," Texas Instruments, Application Report, DLPA044—Dec. 2013. 16 pages.
International Search Report and Written Opinion mailed Nov. 15, 2024, PCT/US2024/047006, 9 pages.

* cited by examiner

*Primary Examiner* — Yassin Alata
(74) *Attorney, Agent, or Firm* — Michael T. Gabrik; Frank D. Cimino

(57) ABSTRACT

Methods and apparatus for optical filtering. In one example, a device includes a spatial light modulator having a two-dimensional array of square, rectangular, or diamond pixels, and a controller coupled to the spatial light modulator. The controller can be configured to write image data representing an image to the spatial light modulator to control the spatial light modulator to display the image for a frame period, and during the frame period, spatially reposition the image on the array of pixels over a plurality of positions, each individual position of the plurality of positions being maintained for a respective time period, wherein the respective time period is selected according to one or more non-negative coefficients of an anti-aliasing filter transfer function.

20 Claims, 7 Drawing Sheets

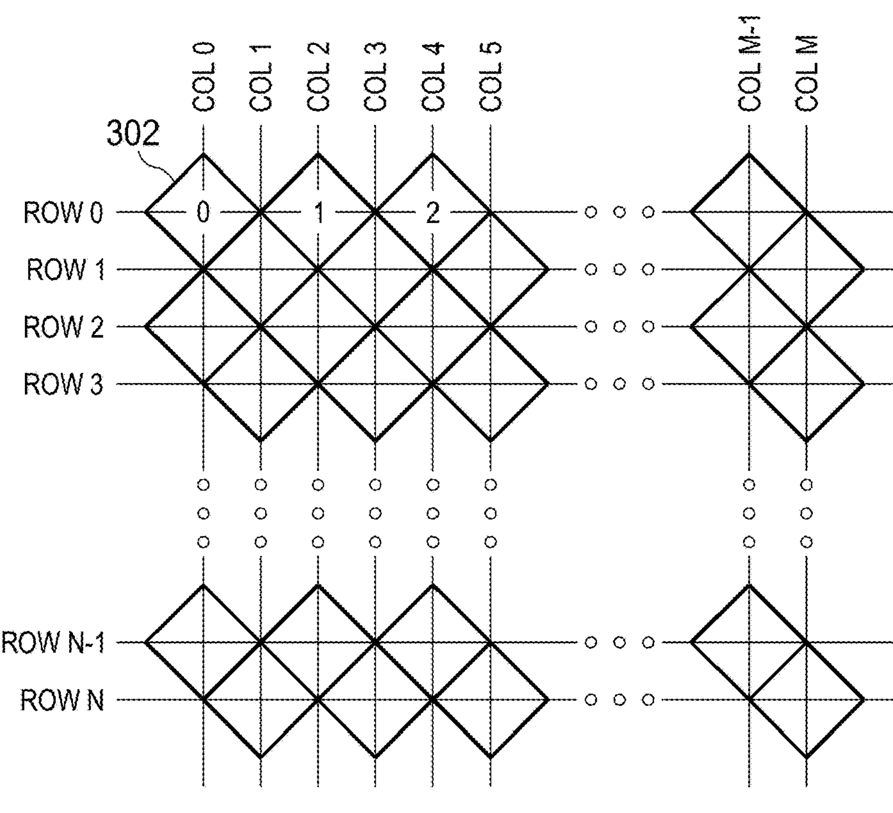
FIG. 3
110
CONTROLLER
114
FILTER
114
102
SPATIAL LIGHT MODULATOR
402
FIG. 4

OPTICAL DIAMOND PASSBAND FILTER

CROSS-REFERENCE TO RELATED APPLICATIONS

This application claims the benefit of and priority to U.S. Provisional Patent Application No. 63/584,932 filed on Sep. 25, 2023, which is hereby incorporated herein by reference in its entirety.

TECHNICAL FIELD

This description relates to digital light projection systems and, more particularly, to spatial light modulators for such systems.

BACKGROUND

Digital light projection systems, such as microdisplays, for example, may include a finite impulse response (FIR) filter in the image processing signal path, for noise and/or aliasing mitigation. Generally, the FIR filter can be implemented digitally, either through software and a graphics processing unit (GPU) or though hardware acceleration and logic gates. However, digital implementation of the coefficients of the FIR filter involve multiplication, addition, and/or division operations that impose a computational burden and corresponding power drain on the system. Accordingly, non-trivial issues remain with respect to filtering in digital light projection systems.

SUMMARY

According to one example, a device comprises a spatial light modulator including a two-dimensional array of pixels, and a controller coupled to the spatial light modulator. The controller can be configured to write image data representing an image to the spatial light modulator to instruct or otherwise control the spatial light modulator to display the image for a frame period, and during the frame period, spatially reposition the image on the array of pixels over a plurality of positions, each individual position of the plurality of positions being maintained for a respective time period, wherein the respective time period is selected according to one or more non-negative coefficients of filter transfer function.

According to another example, a computer program product comprising one or more non-transitory machine-readable mediums having instructions encoded thereon that when executed by at least one processor cause a method for controlling an imaging device to be carried out. The method comprises writing image data representing an image to a spatial light modulator having a an array of pixels, causing the spatial light modulator to display the image for a frame period, and during the frame period, spatially repositioning the image on the array of pixels over a plurality of different positions, wherein causing the spatial light modulator to display the image includes causing the spatial light modulator to display the image at each individual position of the plurality of different positions for a respective percentage of the frame period, and wherein the respective percentages of the frame period are determined by corresponding non-negative coefficients of a filter transfer function.

According to another example, a computer program product comprising one or more non-transitory machine-readable mediums having instructions encoded thereon that when executed by at least one processor cause a method for controlling a device to be carried out. The method comprises receiving image data representing an image frame, and outputting the image data to cause the image data to be displayed on an array of pixels for a frame period, including during the frame period, reformatting the image data to address the image data for display in a plurality of different spatial positions on the array of pixels, and during the frame period, outputting at respective time intervals indicated by non-negative coefficients of a filter transfer function, the image data addressed for display at individual spatial positions of the plurality of different spatial positions.

According to another example, a projection system comprises a spatial light modulator including a two-dimensional array of pixels, a light source configured to illuminate the spatial light modulator, and a controller coupled to the spatial light modulator. The controller can be configured to write image data representing an image to the spatial light modulator, control the spatial light modulator to project the image for a frame period, and during the frame period, cause the image to be spatially repositioned on the array of pixels over a plurality of positions according to a filter transfer function having non-negative coefficients, wherein each non-negative coefficient represents a percentage of the frame period for which an individual position of the plurality of positions is maintained.

BRIEF DESCRIPTION OF THE DRAWINGS

FIG. 3 is a diagram illustrating an addressable spatial light modulator, in an example.

FIG. 4 is a block diagram of a projection system, in an example.

DETAILED DESCRIPTION

Figure 1:
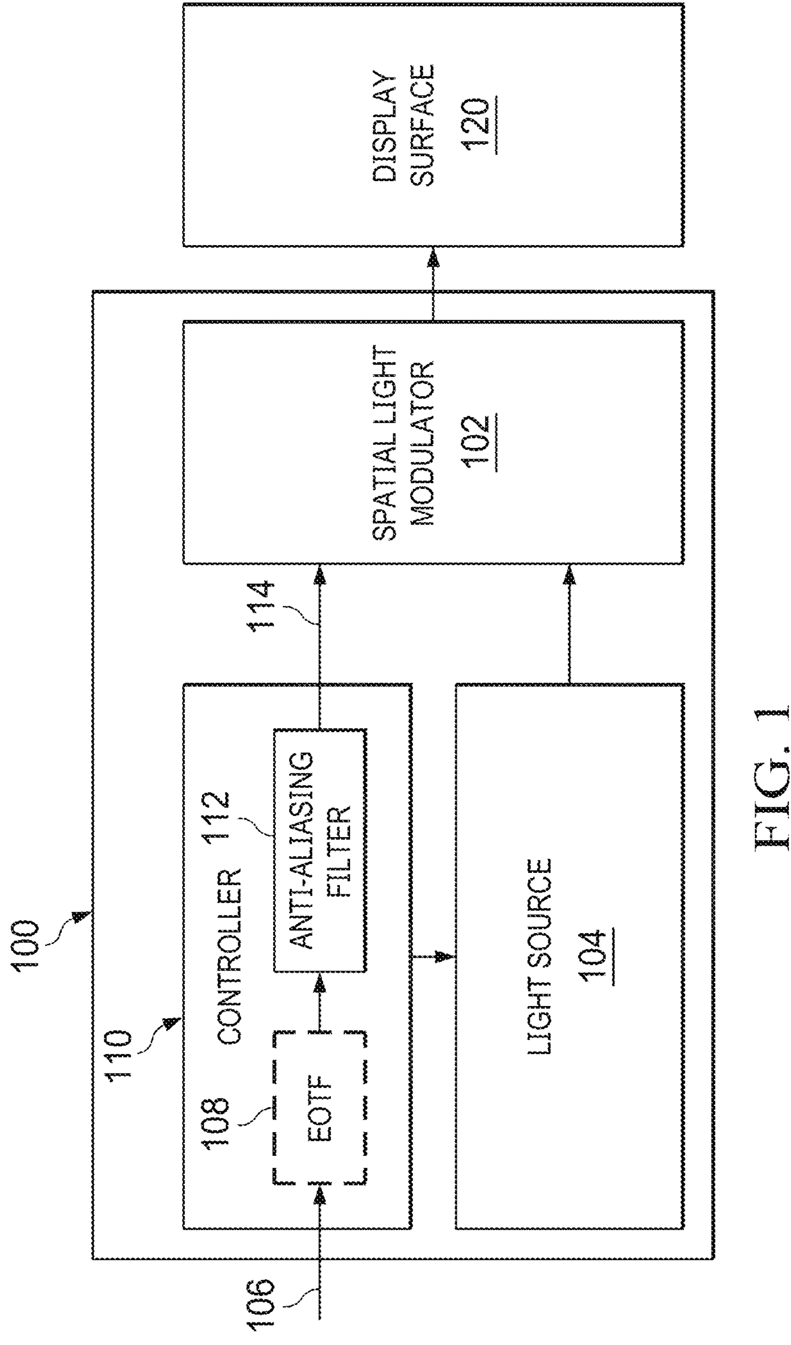
FIG. 1 is a block diagram of a digital light projection system according to certain examples.

Techniques are described for implementing an image filter, such as an anti-aliasing filter, for example, in the optical, rather than digital, domain. Image filters disclosed herein may be used in a variety of digital light projection systems, including fast-switching microdisplays, for example. As described in more detail below, the techniques allow for avoidance of the mathematical operators (e.g., add, multiply, divide) generally associated with digitally-implemented finite impulse response (FIR) filters, and instead employ a time multiplexing approach that leverages the temporal fusion property of human vision. Accordingly, examples provide a filtering solution that may reduce the computational burden of a digitally implemented FIR. In one such example, a device comprises a spatial light modulator including a two-dimensional array of pixels (e.g., square, diamond, or rectangular pixels), and a controller coupled to the spatial light modulator. The controller can be configured to write image data representing an image to the spatial light modulator, control the spatial light modulator to display the image for a frame period, and during the frame period, spatially reposition the image on the array of pixels over a plurality of positions. Each individual position of the plurality of positions may be maintained for a respective time period, wherein the respective time period is selected according to one or more non-negative coefficients of a filter transfer function (e.g., an anti-aliasing or other filter transfer function). The sum of the respective time periods equals the frame period.

General Overview

Digital light processing systems can be used in a wide variety of display systems and applications. In some such systems, a spatial light modulator can be employed to steer visible light and create patterns with speed, precision, and efficiency. The spatial light modulator can be implemented using a micro-mirror display device, such as a digital micro-mirror device (DMD), for example, or a liquid crystal display (LCD) device, such as a liquid crystal on silicon (LCOS) device, for example. An LCD is an electronically modulated optical device that uses the light-modulating properties of liquid crystals, combined with polarizers, to produce an image. An LCOS device is a miniaturized reflective active-matrix liquid-crystal display that uses a liquid crystal layer on top of a silicon backplane. A DMD is an optical micro-electrical-mechanical system (MEMS) that includes an array of highly reflective micro-mirrors. The spatial light modulator can be implemented with a two-dimensional array of pixels arranged in rows and columns, with individual pixels of the array producing corresponding image pixels in a displayed image. For example, in a DMD, individual micro-mirrors represent individual pixels of the array, while in LCOS, liquid crystals applied to a reflective mirror substrate represent individual pixels of the array. In some systems, individual pixels are rectangular, or square. However, in other systems, diamond-shaped pixels can be used. Diamond-shaped pixels can offer advantages. For example, it is often preferable to display/project images with sufficient resolution so as to avoid “pixilation” (e.g., where a human observer sees individual pixels) in the displayed/projected images. Using diamond pixel arrays allows pixilation to be avoided using fewer physical pixels than would be necessary for an equivalently sized image produced with a square or rectangular pixel array. Fewer physical pixels translates to smaller devices and lower cost. Therefore, diamond pixel arrays can be particularly advantageous in space-constrained and/or cost-constrained devices or applications. Furthermore, certain digital light processing systems including a DMD as the spatial light modulator use off-axis illumination, meaning that the light is incident on the mirror array non-perpendicular to the mirror surfaces. When a mirror is tilted “on,” the angle of the mirror directs the light toward a projection lens or other collection optic. As a result, for orthogonal pixel-based projection, the incoming light is introduced from a corner of the array. In contrast, by configuring the pixels in a diamond format, the illumination input to the DMD may enter from any orthogonal edge (e.g., top, bottom, left, or right sides), allowing for smaller mechanical packaging of the optical system. Additionally, side illumination can also allow for increased optical efficiency compared to a corner-illuminated square pixel arrangement.

While diamond pixel arrays can offer advantages, the diamond pixel format can also introduce non-trivial complexities. For example, many images to be projected/displayed by a projection system incorporating a spatial light modulator are sampled based on square or rectangular pixels. Accordingly, in some instances additional signal processing is needed to convert to diamond (“quincunx”) sampling. Additionally, diamond arrays can suffer from aliasing that degrades the reproduction of certain types of images. To address this issue, an anti-aliasing filter can be used in the signal processing chain. This anti-aliasing filter can be implemented as an FIR filter. However, as described above, digitally implemented FIR filters can impose a significant computational burden and corresponding power drain on the system.

Accordingly, techniques are disclosed herein for implementing an image filter, such as an anti-aliasing or noise-reducing filter, for example, in the optical domain. In an example, the techniques can be used to implement a non-negative coefficient FIR filter, without the use of the mathematical operators (e.g., add, multiply, divide) that characterize a digitally-implemented FIR filter. In some examples, this can be accomplished by using a time multiplexing approach in which image data is shifted across a spatial light modulator pixel array.

According to certain examples, a sequence of shifts is performed according to the transfer function of the filter being implemented. The shifting can be completed within a frame period and replicated with each frame. As described further below, with each shift, the image data can be maintained at a particular position on the pixel array for a time period that corresponds to a certain fraction, or percentage, of the total frame period. These time periods can be selected based on the coefficients of the filter transfer function describing the filter being implemented. Thus, unlike a digital-domain filter in which the coefficients describe mathematical computations, an example disclosed herein provides a filter implemented in the optical domain in which the coefficients represent time. This approach leverages natural integration performed by the human vision system. For example, provided that the spatial repositioning, or shifting, of the image is performed faster than the critical flicker frequency (also referred to as the flicker fusion threshold), a human observer generally will not perceive the movement of the image, but rather will perceive the overall integrated effect of the repositioning, and thus the “filtered” image. The critical flicker frequency is the frequency at which a flickering light appears steady to the average human observer. The critical flicker frequency is dependent on the brightness of the display, the brightness of the surrounding environment, the duty cycle of the display (e.g., the ratio of emission time to dark time), and size of the display with respect to the observer (field-of-view in degrees).

According to certain examples, a device includes a spatial light modulator having a two-dimensional array of pixels, and a controller coupled to the spatial light modulator and configured to write image data representing an image to the spatial light modulator and to control the spatial light modulator to display the image for a frame period. To implement an optical-domain filter, the controller can be configured to, during the frame period, spatially reposition the image on the array of pixels over a plurality of positions, with each individual position being maintained for a respective time period, and wherein the respective time period is selected according to one or more coefficients of the filter transfer function. In some examples, the two-dimensional array of pixels is an array of diamond pixels, and the filter is a diamond passband anti-aliasing filter, such as a diamond passband FIR filter, for example. However, in other examples, the techniques disclosed herein can be used to implement other FIR filters described by transfer functions having only non-negative coefficients.

These and other features are described in more detail below.

Example System Architecture

FIG. 1 is a diagram illustrating an example of a projection system 100 that can be used to display or project images on a display surface 120 coupled to the projection system 100. In some examples, the projection system 100 includes a spatial light modulator 102, a light source 104, and a controller 110. The controller 110 receives incoming image data 106 describing an image to be displayed on the display surface 120. In some examples, the incoming image data 106 represents a square-sampled (or rectangle-sampled) image, and may be received from a graphics processing unit or other signal source. The controller 110 may receive the incoming image data 106 over a serial or parallel data interface, for example. The controller 110 may perform various signal processing on the incoming image data 106. For example, the controller 110 may scale or down-sample the incoming image data 106 to match the resolution of the spatial light modulator 102 and/or otherwise format the incoming image data 106 for writing to the spatial light modulator 102, thereby producing processed and/or formatted image data 114.

In some examples, the incoming image data 106 received by the controller 110 is gamma encoded. Gamma encoding of images is used to optimize the usage of bits when encoding an image, and/or the bandwidth used in transferring an image, by taking advantage of the non-linear manner in which humans perceive light and color. For example, humans generally have greater sensitivity to the darker regions of the dynamic range of an image than to the lighter regions. Accordingly, when compressing an image, more digital codes (e.g., bits) can be used to represent the darker regions of the image than to represent the lighter regions. Therefore, in some examples, the controller 110 includes circuitry configured to apply an electro-optical transfer function (EOTF) 108 to remove gamma encoding (or apply de-gamma correction) so that the image can be processed for display by the spatial light modulator 102. In other examples, the EOTF 108 may be implemented by a device external to the controller 110 before the controller 110 receives the incoming image data 106.

The controller 110 can be configured to write the image data 114 to the spatial light modulator 102 for display. The spatial light modulator 102 may be implemented using an LCD, LCOS device or DMD, for example. The spatial light modulator 102 includes a two-dimensional array of pixels that modulates light from the light source 104 based on the image data 114 received from the controller 110 to display the image represented by the image data 114. In some examples, the spatial light modulator 102 includes an array of square or rectangular pixels. However, as described above, in other examples, the spatial light modulator includes an array of diamond pixels. Accordingly, in such examples, the controller 110 may include an anti-aliasing filter 112 to manipulate the image data 114 written to the spatial light modulator. In some examples, the anti-aliasing filter 112 is a diamond passband filter implemented in the optical domain, as described in more detail below.

The controller 110 may be further configured to control the light source 104 to illuminate the spatial light modulator 102 to display the image based on the image data 114. The light source 104 may include one or more light emitting elements, such as light emitting diodes (LEDs), lasers, or laser-illuminated phosphors, for example, along with driver circuitry to control aspects of the light emitting elements (e.g., color, brightness, etc.). In some examples, the controller 110 can be configured to write the image data 114 to the spatial light modulator 102 using pulse width modulation (PWM) timing signals. In such examples, the controller 110 may be further configured to synchronize the PWM timing signals for the spatial light modulator 102 with enable timing signals for driver circuitry of the light source 104 such that the light source 104 can be controlled to appropriately illuminate the spatial light modulator. It will be appreciated that in some implementations of the projection system 100, the controller 110 may include separate controller circuitry for the light source 104 and for the spatial light modulator 102, which may be implemented on separate integrated circuits or as a single integrated circuit. Under control of the controller 110 and illumination by the light source 104, the spatial light modulator 102 displays the image, which can be projected onto the display surface 120.

Using an LED-based light source 104 and a diamond pixel array in the spatial light modulator 102, examples of the projection system 100 may be capable of delivering high resolution and high brightness images, while being packaged in a compact form factor. Accordingly, examples of the projection system 100 may be suitable for a wide variety of applications, including portable 3D machine vision and display solutions used in industrial, medical, and security applications, virtual or augmented reality applications, automotive head-up display (HUD) applications, and/or other image projection applications.

Figure 2:
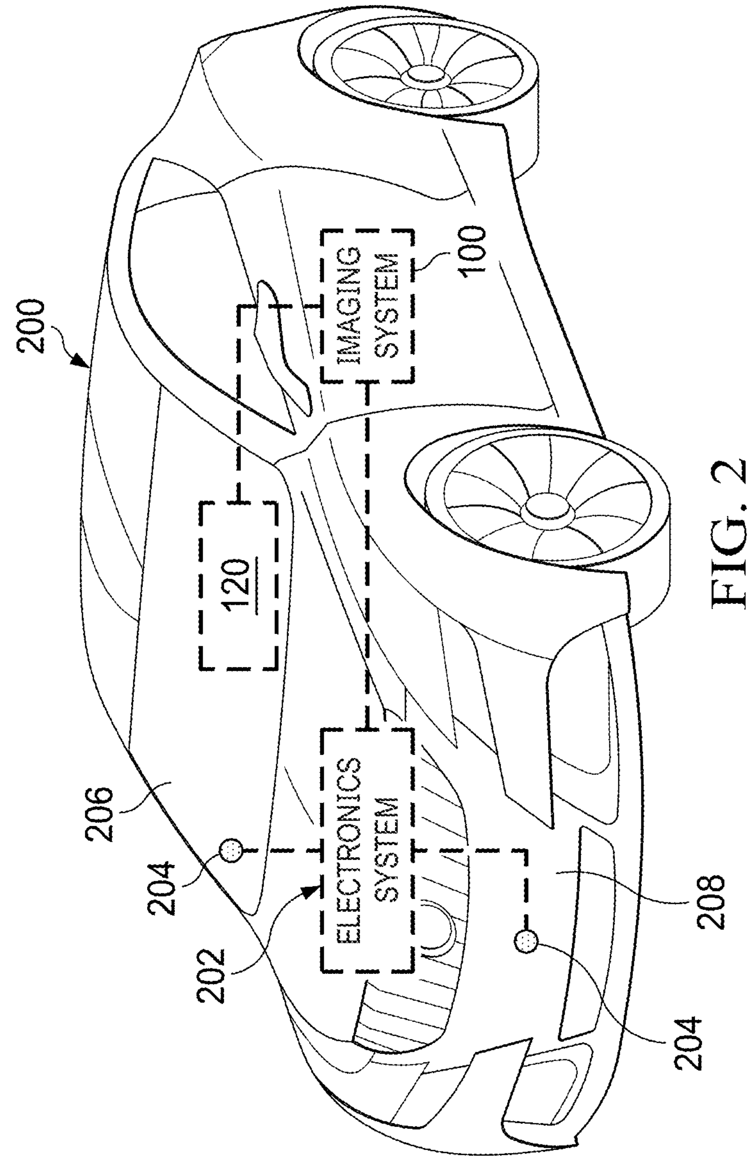
FIG. 2 is a block diagram of vehicle including the digital light projection system of FIG. 1, in an example.

Referring to FIG. 2, there is illustrated an example of the projection system 100 used in an automotive application. In this example, the projection system 100 may be mounted in and/or on a vehicle 200 (e.g., a car, bus, or truck). The projection system 100 may be optically coupled to the display surface 120, as described above with reference to FIG. 1, and configured to project images onto the display surface 120 for viewing by an operator and/or passenger in the vehicle 200. The vehicle 200 may include an electronics system 202 that can be coupled to the projection system 100. In some examples, the vehicle 200 includes one or more sensors 204 disposed at one or more locations in and/or on the vehicle 200. The sensor(s) 204 may be coupled to the electronics system 202 and may provide data that is processed by the electronics system 202 and relayed to the projection system 100 for display on the display surface 120. For example, the sensor(s) 204 may include cameras that capture video imagery to be displayed on the display surface 120. Accordingly, in some such examples, the camera sensors can be positioned on surfaces such as a windshield 206 or front fender/grille 208 of the vehicle 200, as shown in FIG. 2. The sensor(s) 204 may include other types of sensors that acquire information about the vehicle and/or its environment, such as a temperature sensor, an accelerometer, a positioning sensor (e.g., an inertial measurement unit, gyroscope, or other direction/position sensing element), or a fuel gauge, to name a few examples. Sensor data from the sensor(s) 204 can be processed (e.g., formatted, edited, aggregated) by the electronics system 202 and provided to the projection system 100 as the incoming image data 106 described above. In some examples, the electronics system 202 can be configured to add data to the sensor data acquired from the sensor(s) to produce the incoming image data 106 for the projection system 100. For example, the projection system 100 can be configured to display video imagery acquired by one or more camera sensors on the vehicle 200, and the electronics system 202 can be configured to add contextual and/or navigational information to be overlaid on the video imagery when displayed on the display surface 120.

In some examples, the display surface 120 can include a region of a surface of the vehicle 200, such as a region of the windshield 206 (as illustrated in FIG. 2) or one or more side windows, or a surface external to the vehicle 200, such as the ground. In other examples, the display surface 120 can include a screen positioned within the vehicle, such as in a console or dashboard region of the vehicle 200. As described above, in some examples, the display surface 120 may be part of an HUD for the vehicle 200.

Referring now to FIG. 3, there is illustrated a schematic diagram of an example of a pixel array 300 that may be part of the spatial light modulator 102, according to certain examples. The pixel array 300 includes a plurality of pixels 302 arranged in N rows by M columns to form a two-dimensional array. N and M are integer numbers that may be the same or different. Thus, N may be equal to, greater than, or less than M. To allow the controller 110 to write the image data 114 to the spatial light modulator 102 for display, the pixels 302 of the pixel array 300 are addressable by row and/or column. In some examples, addressing is handled through a serial or parallel control bus between the controller 110 and the spatial light modulator 102. In the illustrated example, the pixels 302 are diamond pixels, and due to the diamond pixel configuration, the columns of each odd row are offset by half a pixel from the columns of the even rows. However, in other examples, the pixel array 300 may have a different configuration. For example, the pixels may be square or rectangular pixels, rather than diamond pixels, and/or the columns may not be offset from one another or may be offset by a different amount.

As described above, in some examples, the spatial light modulator is implemented using a DMD array. In some such examples, each pixel 302 includes a micro-mirror and a memory cell. The micro-mirrors can be formed of aluminum, or some other highly reflective material. In some examples, each micro-mirror is tiltable (e.g., via a torsional hinge) between an "on" position and an "off" position, with the position of the micro-mirror determining the direction in which incident light is deflected. In the on position, the micro-mirror may direct illumination from the light source 104 towards a projection or collection optic that may in turn direct the light to the display surface 120 to cause display of the image. In some examples, the memory cell of an individual pixel includes dual CMOS memory elements having complementary states. For example, if one element is logical 1, then the other element is logical 0, and vice versa. In some examples, the CMOS memory cells are one-bit memory cells; however, in other examples, other configurations can be used.

The state of the memory cell may dictate the mechanical position of the mirror and may be controlled according to the image data 114 from the controller 110. The image data 114 is loaded to the pixels 302 (e.g., to the memory cells of the pixels 302) of the pixel array 300 from the controller 110. In some examples, the image data is loaded to the pixel array 300 via a double data rate (DDR) interface. A DDR interface allows data transfer to occur on both edges of a clock pulse, thus allowing two data transfers per clock cycle. This high speed data input to the spatial light modulator 102 allows for a maximum update rate of the entire pixel array 300 to be on the order to several kilohertz (e.g., about 5 kHz) in some examples, which may allow for the projection of seamless digital images using PWM signals. In some examples, the image data 114 can be loaded to pixel array 300 in rows, columns, or blocks (e.g., a selected number of pixels per row and/or column). Alternatively, a complete image frame can be loaded to the entire pixel array 300. Once the data is loaded to the memory cells of the pixels 302, a mirror clocking pulse can be sent to the pixels to cause the micro-mirrors to be switched to a desired state based on the data in the underlying memory cell. For example, the mirrors can be switched from on to off, off to on, or remain in the same state as in the previous clock cycle. Thus, in some examples, the angular position of a specific micro-mirror is determined by the binary state (logic 0 or 1) of the corresponding CMOS memory cell contents, after the mirror clocking pulse is applied.

As also described above, in some examples, the spatial light modulator is implemented using an LCD device, such as an LCOS device or other type of LCD device. In some such examples, each pixel 302 includes sample and hold circuitry to control the pixel between an "on" state in which the pixel displays light and an "off" state in which the pixel is dark (e.g., black). In color applications, different pixels 302 may have different color filters, such that they display different colors in the "on" state. For example, the pixel array 300 may include red, green, and blue pixels 302, for example. To display an image frame, image data representing the image is written/loaded to pixels 302 (e.g., to the sample and hold circuitry of the pixels 302) from the controller 110. The sample and hold circuitry then holds each pixel 302 in either the "on" state or the "off" state, according to the loaded image data, for the frame period. As described above, pixels 302 can be addressed individually, or by row, column, or block, for example. Alternatively, a complete image frame can be loaded to the entire pixel array 300.

Thus, for a given image frame, the spatial light modulator 102 can be controlled to display the corresponding image described by the image data 114. In certain examples, the spatial light modulator 102, under control of the controller 110, refreshes the displayed image at a particular frame rate, and may repeat the last active frame for intervals in which no new image frame is received. The frame rate may be determined by a source frame rate of the incoming image data 106, for example.

Turning now to FIG. 4, as described above, the controller 110 can be configured to implement a filter 402. In certain examples, the filter 402 is implemented in the optical domain by rapidly spatially repositioning the image on the pixel array 300 during a given frame period. The manner in which the image is spatially repositioned during the frame period may be determined by the transfer function of the filter 402 being implemented. For example, the transfer function, y[n], of a 2×2 FIR filter may be described by the following function:

$$y[n] = c1 * x[n-1] + c2 * x[n] + c3 * x[n+1] \tag{F1}$$

In Function F1, c1, c2, and c3 are the filter coefficients for term of the filter transfer, y[n]. For a digital filter, the FIR output may be derived by multiplying the center pixel (x[n]) by the value of the coefficient c2, multiplying the pixel to the left of the center pixel (x[n−1]) by the value of the coefficient c1, multiplying the pixel to the right of the center pixel (x[n+1]) by the value of the coefficient c3, and summing the three results together. In contrast, for an optical domain implementation of the FIR filter, the terms of the filter transfer function, y[n], describe the spatial position of the image on the pixel array 300, and the coefficients describe the amount of time (as a percentage of the frame period) for which the image is maintained at each of the spatial positions.

The filter transfer function, and the values of the coefficients, are determined by the desired passband (in frequency space) and characteristics of the filter 402 being implemented. For example, an anti-aliasing filter may have a transfer function and coefficient values selected such that the filter frequency response (e.g., magnitude of attenuation at particular frequencies) suppresses frequencies at which aliasing may occur. For some noise-reducing applications, the filter 402 may be implemented as a low-pass filter, for example. Similarly, in some examples, a bandpass filter may be implemented with a frequency response that rejects certain frequencies or frequency ranges to improve image quality. The order of the filter (e.g., 2×2, 3×3, etc.) and the values of the coefficients determine the shape of the filter frequency response, including characteristics such as the frequency range(s) corresponding to the filter passband(s) and stopband(s), the amount of attenuation in the passband (s) and stopband(s), and the steepness of transition between the passband(s) and stopband(s). The filter designer may select optimal coefficients to produce a filter frequency response that has a shape (in frequency space) based on the goal/application for the filter 402.

Figure 5:
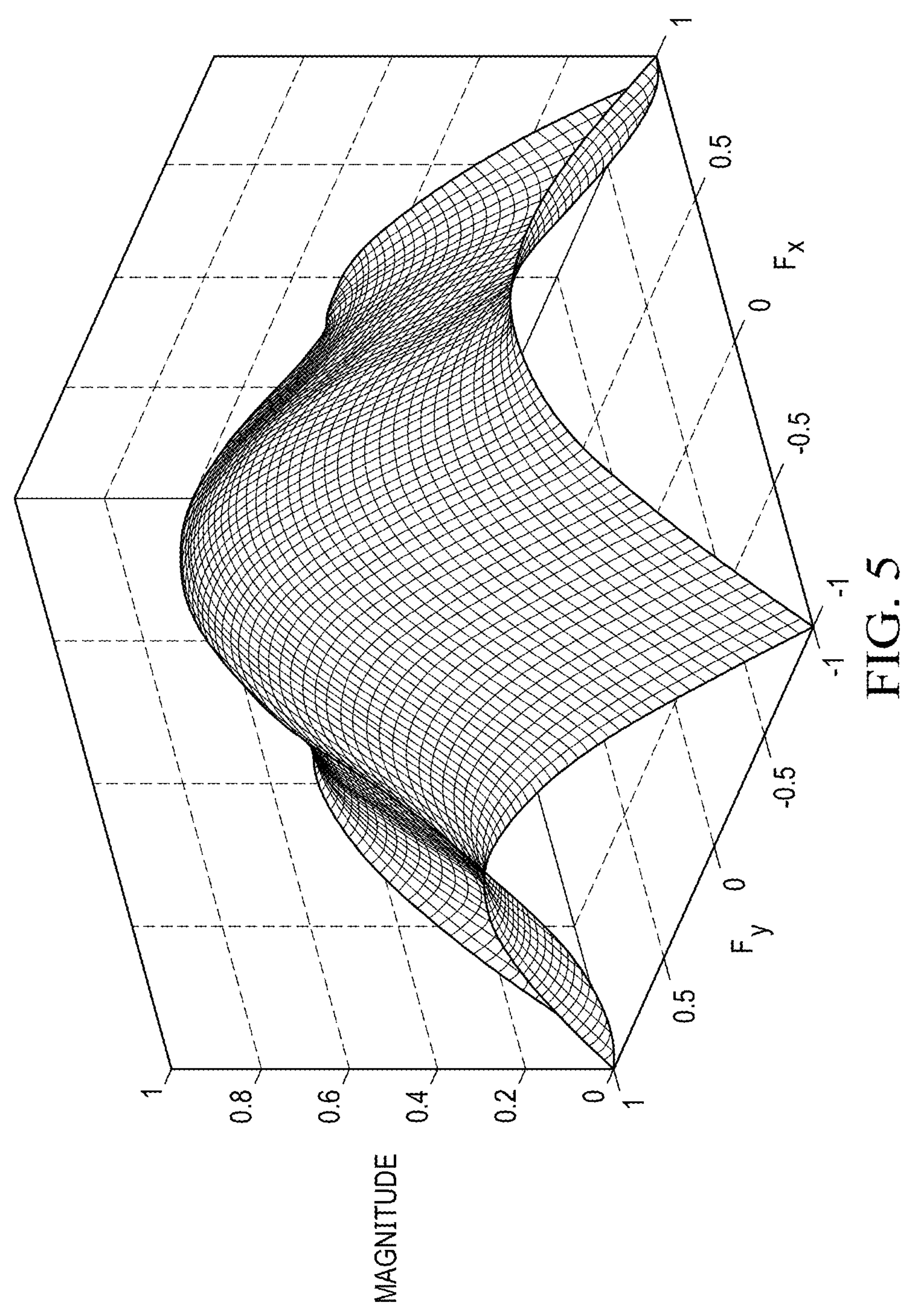
FIG. 5 is a graph illustrating a filter frequency response, in an example.

In some examples, the filter transfer function is an anti-aliasing FIR filter transfer function. For example, Table 1 below provides an example of a 2×2 diamond passband anti-aliasing FIR filter transfer function in which c1=0.25, c2=0.5, and c3=0.25. This filter is referred to as "diamond passband" because the frequency response of the filter has a diamond shape in frequency space. An example of the filter is illustrated in FIG. 5.

TABLE 1

| | |
|---|---|
| 0.5 | 0.25 |
| 0.25 | 0 |

It will be appreciated, however, that numerous other coefficient values could be selected, depending on the desired shape and characteristics of the frequency response of the filter 402 being implemented. For example, selecting coefficients of ⅓, ⅔, and ⅓ (instead of ¼, ½, and ¼ as in the example of Table 1) will produce a filter response having a different shape and different characteristics than that shown in FIG. 5. According to certain examples, the coefficient values are constrained only in that they must be non-negative (to allow implementation in the optical domain) and that the sum of the coefficients (expressed as percentages of the frame period) is less than or equal to 1. In some examples, it is preferable that the sum of the coefficients equals the frame period (i.e., equals 1), to avoid causing a DC offset in the display of the image. Within these constraints, the filter designer can select coefficients to achieve a desired frequency response for a given application.

To implement the filter described by Table 1 and function F1 in the optical domain, the image is spatially repositioned on the pixel array 300 during a given frame period, as described above. For this example, the image is shifted to the left by one pixel and displayed for 25% of the frame period. Then, the image is re-centered and displayed for 50% of the frame period. Finally, the image is shifted to upwards by one pixel and displayed for the remaining 25% of the frame period. Alternatively, the same result can be achieved by shifting the image one pixel to the right and displaying the image at that position for 25% of the frame period, recentering and displaying the image for 50% of the frame period, and shifting the image downwards by one pixel and displaying the image in that position for the remaining 25% of the frame period. The order or sequence of the shifts may not be important. Rather, the desired FIR filtering effect may be achieved simply by maintaining the image at the various different spatial positions for the time periods described by the coefficients. Provided that the shifts are performed quickly enough (e.g., faster than the critical flicker frequency, as described above), in any sequence, a human observer perceives the integrated result. Thus, the human observer performs the summation that is otherwise accomplished through digital logic, as described above.

For an average human observer, the critical flicker frequency may be approximately 60 Hz, or possibly less. As noted above, the critical flicker frequency can vary from application to application and over different operating conditions as it is dependent on factors such as the brightness of the display, the brightness of the surrounding environment, the duty cycle of the display, and the size of the display relative to the observer. Accordingly, in some instances, the critical flicker frequency may be higher than 60 Hz. Thus, the frame rate and/or rate of position shifting of the image may be adjusted based on an estimated critical flicker frequency for a given implementation of the projection system and/or application. For a frame rate of 60 Hz, for example, and therefore a frame period of 16.67 milliseconds (ms), in the above example, the image is displayed at the central position for 8.34 ms, at the left-shifted (or right-shifted) position for 4.17 ms, and at the up-shifted (or down-shifted) position for 4.17 ms.

In some examples, to achieve the spatial repositioning of the image during the frame period, the controller 110 writes the image data 114 to the pixels 302 of the pixel array 300 for each positioning of the image, in sequence, according to the row and column addressing described above. In the DMD array example described above, the image data 114 can be written to the pixel memory cells for a first position of the image on the pixel array 300, and a mirror clocking pulse can be applied to set the micro-mirrors to display the corresponding image. The image can be displayed in this first position for a first time period. While the image is displayed in the first position, the controller 110 can rewrite the image data 114 for the same image frame to the pixel array 300 for the next spatial positioning of the image. For example, to shift the image one pixel to the left, the controller 110 may write the image data to the pixels 302 corresponding to the one pixel shift (e.g., referring to FIG. 3, image data formerly written to pixel 2 can be written to pixel 1, and image data formerly written to pixel 1 can be written to pixel 0, and so forth). At the end of the first time period, another mirror clocking pulse can be applied to set the micro-mirrors to display the image in the second position. This procedure can be repeated during the frame period to display the image at each of the designated spatial positions for the respective time periods described by the corresponding filter coefficients. For an LCD or LCOS array, for example, the controller 110 can write the image data to the pixels 302 and the sample and hold circuitry maintains the corresponding pixel state (e.g., on or off) for the time duration specified by the current coefficient. For the next position, the shifted image data is written to the pixels 302 as described above, the sample and hold circuitry maintains the new corresponding pixel state for the time duration specified by the next coefficient. This process is repeated during the frame period to display the image at each of the designated spatial positions for the respective time periods described by the corresponding filter coefficients.

This approach can be applied for a wide variety of different filter transfer functions, not limited to the 2×2 example described above. For example, Table 2 below provides an example of coefficients for a 3×3 diamond passband FIR filter transfer function.

TABLE 2

| | | |
|---|---|---|
| 0 | 0.13 | 0 |
| 0.13 | 0.48 | 0.13 |
| 0 | 0.13 | 0 |

To implement the filter of Table 2 in the optical domain, the following set of shifts can be applied. The image is displayed at the centered position for 48% of the frame period. The image is shifted upwards from the center position by one pixel and displayed for 13% of the frame period. Similarly, the image is shifted one pixel to the left of the center position and displayed for 13% of the frame period, and then shifted one pixel to the right of the center position and displayed for 13% of the frame period. Lastly, the image is shifted downwards from the center position by one pixel and displayed for 13% of the frame period. As described above, the order or sequence of the shifts is not necessarily important, only that the image is displayed in the respective positions for the time periods specified by the corresponding coefficients.

The order and characteristics of the filter 402 implemented according to principles disclosed herein may be tailored to any particular application and/or system configuration. For example, the filter 402 may be an implementation of the anti-aliasing filter 112 of FIG. 1. As described above, in some examples, the filter 402 is subject to the following constraints: 1) the coefficients are non-negative coefficients because the coefficients are implemented as time periods, and 2) the controller 110 and/or spatial light modulator 102 are capable of performing the spatial repositioning sufficiently quickly to achieve the series of coefficients within a given frame period.

As described above, in some applications, the critical flicker frequency may generally be approximately 60 Hz. Accordingly, in some examples, it is preferable to select a frame rate of at least 60 Hz. In the above-described 2×2 FIR example, this involves maintaining the image at one position for approximately 4.17 ms. Similarly, for the 3×3 FIR example shown in Table 2 above and a 60 Hz frame rate, the system maintains the image in one position for approximately 2.17 ms. In some examples in which the spatial light modulator 102 is implemented using a DMD array, the controller 110 may be capable of writing the image data to the pixel array 300 at a rate of up to about 5 kHz. This is more than sufficiently fast to implement a 2×2, 3×3, or potentially higher-order FIR filter as described herein.

Methodology

As described above, examples provide techniques by which a filter for a pixelated spatial light modulator can be implemented in the optical domain, thereby avoiding the computational burden that can be associated with digital filtering. In some examples, the techniques described herein can be used to implement a FIR anti-aliasing filter for a diamond array spatial light modulator. However, in other examples, the approach can be applied to implement other types of filters (e.g., noise-reducing filters, such as low-pass or band-pass filters, not limited to anti-aliasing filters) for spatial light modulators having various pixel array configurations, not limited to diamond arrays.

Figure 6A:
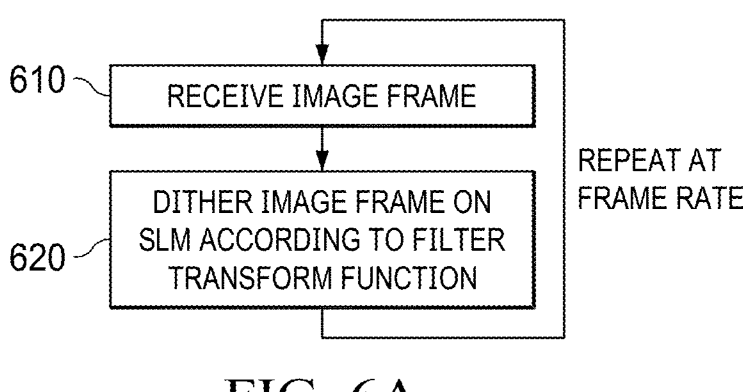
FIG. 6A is a flow diagram of a method of operating a diamond passband filter in the optical domain, in an example.

FIG. 6A is a flow diagram of one example of a filtering methodology according to certain aspects of the disclosed technology. As described above, in some examples, the filtering methodology includes spatially repositioning an image frame on a spatial light modulator for a sequence of time periods, wherein durations of individual time periods in the sequence of time periods are selected according to coefficients of a filter transfer function, and wherein a sum of the time durations of the individual time periods in the sequence of time periods is equal to a frame display period of the spatial light modulator.

Thus, at operation 610, an image frame may be received. For example, the image frame may be received by the controller 110 as a stream of incoming image data 106, as described above. The controller 110 may write the image frame to the spatial light modulator 102 by writing pixels of the image data to pixels 302 of the pixel array 300, as described above.

At operation 620, the image frame is dithered, or spatially repositioned, on the spatial light modulator according to a transfer function of the filter being implemented. As described above, in some examples, this can be achieved through the controller rewriting the image data for the received image frame to different pixels 302 in the pixel array 300.

Operations 610 and 620 can be repeated at a frame rate of the incoming image frames, for example.

Figure 7:
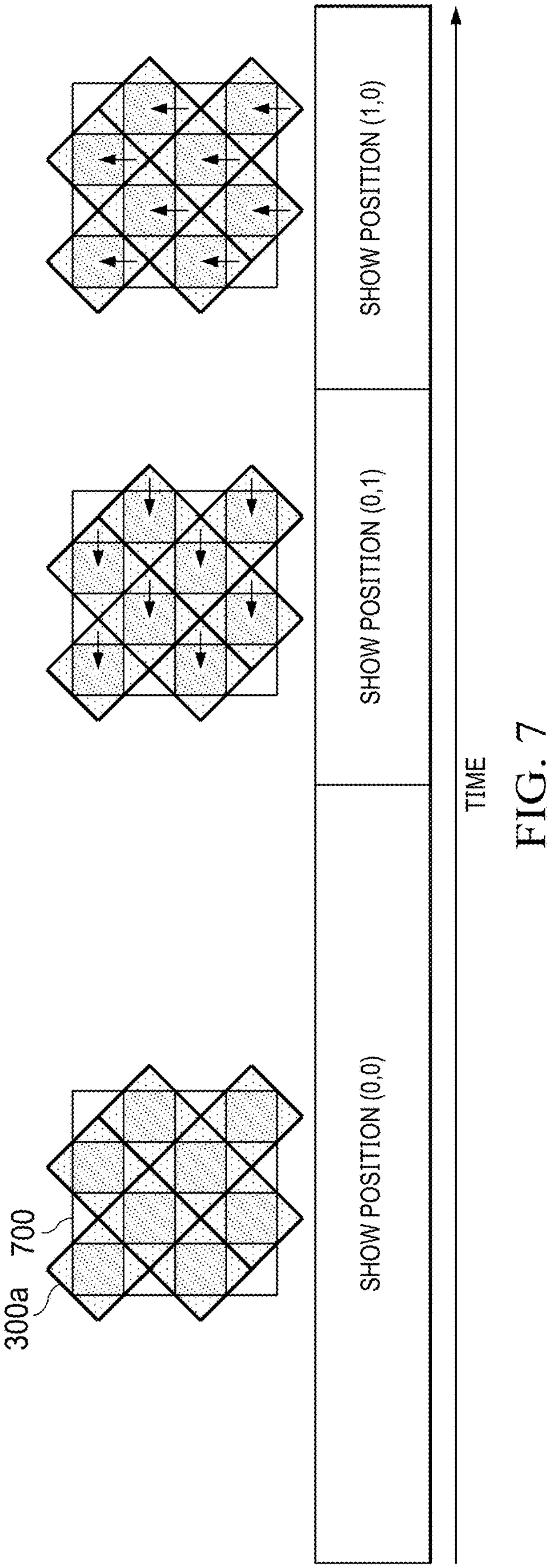
FIG. 7 is a diagram illustrating operation of an optical diamond passband filter, in an example.

An example of this repositioning, corresponding to the filter transfer function of Table 1 and Function F1, is illustrated in FIG. 7. Referring to FIG. 7, an example is shown of an image frame 700 being spatially repositioned on a pixel array 300*a* over time, as described above. Thus, for the 2×2 FIR filter example of Table 1, the image frame 700 is displayed at three different spatial positions over time, with the total amount of display time being equal to the frame period. As described above, the image frame is displayed at the central (0,0) position for 50% of the frame period, then shifted and displayed at the left-shifted (0,1) position for 25% of the frame period, and then shifted again and displayed at the up-shifted (1,0) position for another 25% of the frame period. The shifting can be repeated with each new image frame. As also described above, this example filter can also be implemented by shifting the image frame right and down (for the respective time periods), instead of left and up. In addition, the sequence of the shifts can be varied, provided that the image is displayed in the respective positions for the time durations specified by the coefficients.

Figure 6B:
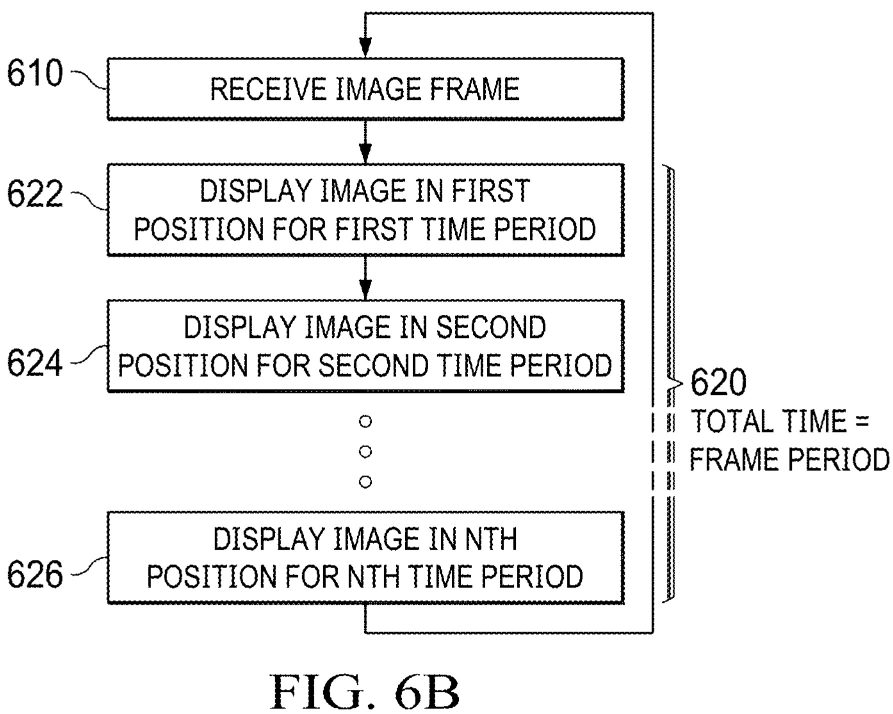
FIG. 6B is a flow diagram of an example of the method of FIG. 6A, according to certain aspects.

FIG. 6B is a flow diagram of an implementation of the method of FIG. 6A, according to certain examples. As described above, operation 620 can include controlling the spatial light modulator 102 to display a given image frame at a plurality of different spatial positions on the pixel array 300 over the frame period. For each frame, the image can be maintained at each of the different spatial positions for a time period that is set by a corresponding one or more (non-negative) coefficients of the filter transfer function. As described above, in some examples, each non-negative coefficient of the filter transfer function specifies a percentage of the frame period for which the image is maintained in the respective spatial position.

Thus, according to some examples, at operation 622, the image is displayed in a first position on the pixel array 300 for a first time period. At operation 624, which may occur at the end of operation 622, the image is displayed at a second position on the pixel array 300 for a second time period. This process may be continued any number of times, depending, for example, on the order of the filter being implemented, until at operation 626, the image is displayed in an nth position for an nth time period. N may be any positive integer number greater than two. As described above, in some examples, the sum of all the time periods is equal to the frame period. This may be a desirable condition so as to avoid causing a DC offset in the overall/combined display of the image. However, in other examples, it is possible that the sum of all the time periods can be less than the complete frame period.

Figure 8:
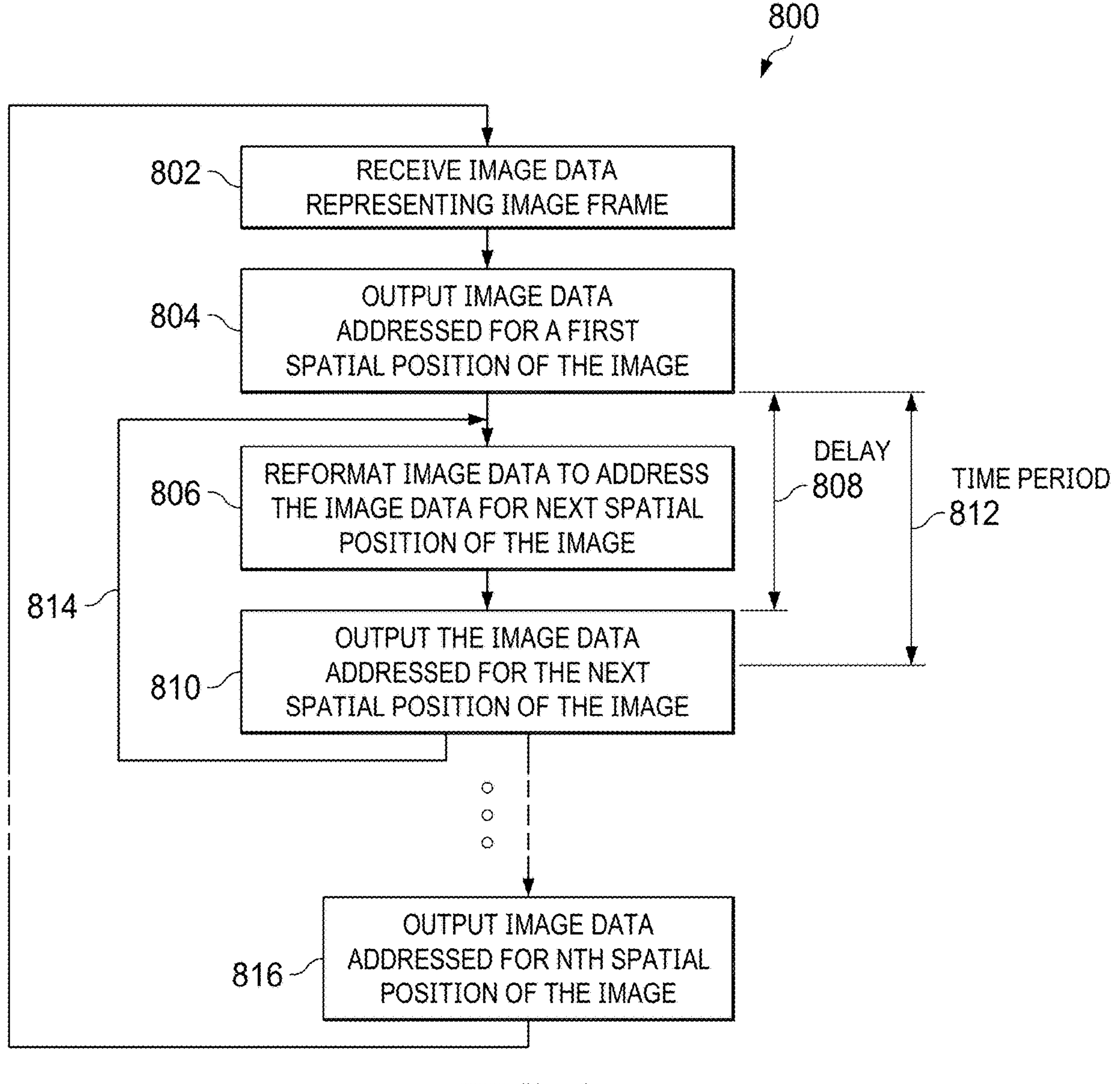
FIG. 8 is a flow diagram of a process for operating a controller, according to certain aspects.

Referring to FIG. 8, there is illustrated a flow diagram of a process 800 for the controller 110 to implement the method of FIG. 6B.

At operation 802, the controller 110 receives image data (e.g., image data 106 described above with reference to FIG. 1) representing a current image frame to be displayed.

At operation 804, the controller 110 outputs image data (e.g., the image data 114 of FIGS. 1 and/or 4) addressed for display in a first spatial position on the pixel array 300. In examples in which the spatial light modulator 102 is an LCD/LCOS device, operation 804 may include providing the output image data 114 to the sample and hold circuitry associated with each pixel 302, as described above. In examples in which the spatial light modulator 102 is a DMD device, operation 804 may include both writing the output image data 114 to the memory cells associated with each pixel 302 and providing a control signal, for example, the mirror clocking pulse described above, to cause the DMD device to project/display the image frame.

At operation 806, the controller 110 formats the image data to address the image data for display at a next spatial position on the pixel array 300. For example, as described above, to shift the image one pixel to the left, the controller 110 may address the image data to the pixels 302 corresponding to the one pixel shift (e.g., referring to FIG. 3, image data formerly addressed for pixel 2 can be addressed for pixel 1, and image data formerly addressed for pixel 1 can be addressed for pixel 0, and so forth). Similar adjustments can be made to shift the image in other dimensions/directions, as will be appreciated given the benefit of this disclosure.

After a certain delay period 808, at operation 810, the controller 110 outputs the reformatted image data addressed for the next spatial position on the pixel array 300. As described above, the controller 110 can be configured to control the spatial light modulator 102 to display the image frame at plurality of different spatial positions on the pixel array 300 over the frame period, with the image being maintained at each of the different spatial positions for a time period that is set by a corresponding one or more (non-negative) coefficients of the filter transfer function. Accordingly, once the controller 110 outputs the image data addressed for the first spatial position (at operation 804), the image may be maintained at that position for a time duration that is specified by the corresponding filter coefficient for that spatial position. Therefore, the controller 110 may wait for the delay period 808 before outputting the reformatted image data addressed for the next spatial position of the image frame on the pixel array. In some examples, the delay period 808 corresponds to the time duration for which the image is maintained at the first spatial position. In some examples, to cause the spatial light modulator 102 to display the image frame at the next spatial position, the controller 110 outputs both the reformatted image data and a control signal (e.g., the mirror clocking pulse in the case of a DMD array) that causes the spatial light modulator to "switch" and display the image frame at the new spatial position. Accordingly, in such examples, the delay period 808 may be less than the time period 812 specified by the corresponding filter coefficient. For example, at operation 810, the controller 110 may write the reformatted image data to the pixel array 300 after the delay period 808 and then apply the control signal at the end of the time period 812 (which may be the same or longer than the delay period 808) to cause the spatial light modulator 102 to display the image frame at the new spatial position.

Operations 806 and 810 can be repeated for the plurality of spatial positions determined by the particular filter transfer function being implemented, as indicated by arrow 814.

Once the controller 110 outputs the image data addressed for the final (e.g., Nth, with N being a positive integer) spatial position for a given image frame (at operation 816), the process 800 may be repeated for the next image frame.

Thus, the controller 110 can format and output the image data for any given image frame in a sequence of steps. At each step, the image data is addressed for the pixel array 300 such that the image frame is displayed in a particular spatial position on the array. The time between each step in the sequence is determined based on the coefficients of the filter transfer function, as described above. In some examples in which there is a difference between the delay period 808 and the time period 812, the delay period 808 may be based in part on the filter coefficient that sets the time period 812 and also on an internal configuration or characteristics of the controller 110, such as a clock rate or other timing considerations between when the image data 114 is written to the pixel array 300 and when the control signal (e.g., a mirror clocking pulse or other control signal) is sent from the controller 110 to the spatial light modulator 102.

FURTHER EXAMPLES

Example 1 is a diamond passband anti-aliasing filter implemented in the optical domain.

Example 2 includes the diamond passband anti-aliasing filter of Example 1, wherein the diamond passband anti-aliasing filter is a finite impulse response filter having non-negative coefficients.

Example 3 is a filtering method for a diamond pixel array, the method comprising spatially repositioning an image on a digital micromirror device for a sequence of time periods, wherein durations of individual time periods in the sequence of time periods are selected according to coefficients of an anti-aliasing filter transfer function, and wherein a sum of the time durations of the individual time periods in the sequence of time periods is equal to a frame display period of the digital micromirror device.

Example 4 is a device comprising a spatial light modulator including a two-dimensional array of pixels; and a controller coupled to the spatial light modulator and configured to write image data representing an image to the spatial light modulator to instruct the spatial light modulator to display the image for a frame period, and during the frame period, spatially reposition the image on the array of pixels over a plurality of positions, each individual position of the plurality of positions being maintained for a respective time period, wherein the respective time period is selected according to one or more non-negative coefficients of a filter transfer function.

Example 5 includes the device of Example 4, wherein the pixels are diamond pixels, and wherein the filter transfer function is a diamond passband anti-aliasing filter transfer function.

Example 6 includes the device of Example 4, wherein the pixels are square pixels.

Example 7 includes the device of one of Examples 5 or 6, wherein the filter transfer function is a finite impulse response filter transfer function.

Example 8 includes the device of Example 6, wherein the finite impulse response filter transfer function is one of a two-by-two finite impulse response filter transfer function or a three-by-three finite impulse response filter transfer function.

Example 9 includes the device of any one of Examples 4-8, wherein individual coefficients of the filter transfer function specify percentages of the frame period for the respective time periods.

Example 10 includes the device of any one of Examples 4-9, wherein the spatial light modulator is a digital micromirror device.

Example 11 includes the device of any one of Examples 4-9, wherein the spatial light modulator is a liquid crystal on silicon device.

Example 12 includes the device of any one of Examples 4-11, wherein the controller is configured to spatially reposition the image of the array of pixels over the plurality of positions at a rate faster than a critical flicker frequency.

Example 13 includes the device of any one of Examples 4-12, wherein the controller is further configured to: receive a signal representing the image; and apply an electro-optical transfer function to the signal to produce the data representing the image.

Example 14 includes the device of any one of Examples 4-13, wherein to spatially reposition the image on the array of pixels, the controller is configured to: output the image data addressed for a first spatial position on the array of pixels; reformat the image data to address the image data for a second spatial position on the array of pixels; and after a delay period following the output of the image data addressed for the first spatial position, output the image data addressed for the second spatial position on the array of pixels.

Example 15 includes the device of Example 14, wherein the delay period is determined based on at least one of the non-negative coefficients of the filter transfer function.

Example 16 is a computer program product comprising one or more non-transitory machine-readable mediums having instructions encoded thereon that when executed by at least one processor cause a method for controlling an imaging device to be carried out. The method comprises writing image data representing an image to a spatial light modulator having an array of pixels; causing the spatial light modulator to display the image for a frame period; and during the frame period, spatially repositioning the image on the array of pixels over a plurality of different positions; wherein causing the spatial light modulator to display the image includes causing the spatial light modulator to display the image at each individual position of the plurality of different positions for a respective percentage of the frame period; and wherein the respective percentages of the frame period are determined by corresponding non-negative coefficients of a filter transfer function.

Example 17 includes the computer program product of Example 16, wherein the pixels are diamond pixels, and wherein the filter transfer function is a diamond passband anti-aliasing filter transfer function.

Example 18 includes the computer program product of Example 17, wherein the diamond passband anti-aliasing filter transfer function is a finite impulse response filter transfer function.

Example 19 includes the computer program product of Example 18, wherein the finite impulse response filter transfer function is one of a two-by-two finite impulse response filter transfer function or a three-by-three finite impulse response filter transfer function.

Example 20 includes the computer program product of Example 16, wherein the pixels are square pixels.

Example 21 includes the computer program product of Example 20, wherein the filter transfer function is a finite impulse response filter transfer function.

Example 22 includes the computer program product of Example 21, wherein the finite impulse response filter transfer function is one of a two-by-two finite impulse response filter transfer function or a three-by-three finite impulse response filter transfer function.

Example 23 includes the computer program product of any one of Examples 16-22, wherein spatially repositioning the image on the array of pixels over a plurality of different positions includes spatially repositioning the image over the plurality of different positions at a rate faster than a critical flicker frequency.

Example 24 includes the computer program product of Example 23, wherein the critical flicker frequency is 60 Hz.

Example 25 is an projection system comprising: a spatial light modulator including a two-dimensional array of pixels; a light source configured to illuminate the spatial light modulator; and a controller coupled to the spatial light modulator and configured to write image data representing an image to the spatial light modulator, control the spatial light modulator to project the image, based on the image data and light received from the light source, for a frame period, and during the frame period, cause the image to be spatially repositioned on the array of pixels over a plurality of positions according to a filter transfer function having non-negative coefficients, wherein each non-negative coefficient represents a percentage of the frame period for which an individual position of the plurality of positions is maintained.

Example 26 includes the projection system of Example 25, wherein the spatial light modulator is a digital micromirror device.

Example 27 includes the projection system of Example 25, wherein the spatial light modulator is a liquid crystal on silicon device.

Example 28 includes the projection system of any one of Examples 25-27, wherein the pixels are diamond pixels, and wherein the filter transfer function is a diamond passband anti-aliasing filter transfer function.

Example 29 includes the projection system of any one of Examples 25-27, wherein the pixels are square pixels.

Example 30 includes the projection system of one of Examples 28 or 29, wherein the filter transfer function is a finite impulse response filter transfer function.

Example 31 includes the projection system of Example 30, wherein the finite impulse response filter transfer function is one of a two-by-two finite impulse response filter transfer function or a three-by-three finite impulse response filter transfer function.

Example 32 includes the projection system of any one of Examples 25-31, wherein the light source comprises one or more light emitting diodes.

Example 33 includes the projection system of any one of Examples 25-32, wherein the controller is configured to cause the image to be spatially repositioned over the plurality of different positions at a rate faster than a critical flicker frequency.

Example 34 includes the projection system of Example 33 wherein the critical flicker frequency is 60 Hz.

Example 35 includes the projection system of any one of Examples 25-35, further comprising a display element configured to display the image projected by the spatial light modulator.

Example 36 includes the projection system of Example 35, wherein the display element comprises a head-up display for a vehicle.

Example 37 includes the projection system of Example 36, wherein the display element comprises a liquid crystal display.

Example 38 is a computer program product comprising one or more non-transitory machine-readable mediums having instructions encoded thereon that when executed by at least one processor cause a method for controlling a device to be carried out, the method comprising: receiving image data representing an image frame; and outputting the image data to cause the image data to be displayed on an array of pixels for a frame period, including during the frame period, reformatting the image data to address the image data for display in a plurality of different spatial positions on the array of pixels, and during the frame period, outputting at respective time intervals indicated by non-negative coefficients of a filter transfer function, the image data addressed for display at individual spatial positions of the plurality of different spatial positions.

Example 39 includes the computer program product of Example 38, wherein the filter transfer function is a finite impulse response diamond passband anti-aliasing filter transfer function.

Example 40 includes the computer program product of Example 39, wherein the filter transfer function is one of a two-by-two finite impulse response filter transfer function or a three-by-three finite impulse response filter transfer function.

Example 41 includes the computer program product of any one of Examples 38-40, wherein outputting the image data addressed for display at the individual spatial positions of the plurality of different spatial positions comprises, for each respective time interval, outputting the image data, and providing a control signal to cause display of the image data at the respective spatial position on the array of pixels for a time period specified by a corresponding coefficient of the filter transfer function.

Example 42 includes the computer program product of any one of Examples 38-41, wherein outputting the image data addressed for display at the individual spatial positions comprises outputting the image data at a rate faster than a critical flicker frequency.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end user and/or a third party.

While the use of particular transistors is described herein, other transistors (or equivalent devices) may be used instead. For example, a p-channel field effect transistor (PFET) may be used in place of an n-channel field effect transistor (NFET) with little or no changes to the circuit. Furthermore, other types of transistors may be used (such as bipolar junction transistors (BJTs)). Furthermore, the devices may be implemented in/over a silicon substrate (Si), a silicon carbide substrate (SiC), a gallium nitride substrate (GaN) or a gallium arsenide substrate (GaAs). Moreover, reference to transistor features such as gate, source, or drain is not intended to exclude any suitable transistor technologies. For instance, features such as source, drain, and gate are typically used to refer to a FET, while emitter, collector, and base are typically used to refer to a BJT. Such features may be used interchangeably herein. For instance, reference to the gate of a transistor may refer to either the gate of a FET or the base of a BJT, and vice-versa. In some examples, a control terminal may refer to either the gate of a FET or the base of a BJT. Any other suitable transistor technologies can be used. Any such transistors can be used as a switch, with the gate or base or other comparable feature acting as a switch select input that can be driven to connect the source and drain (or the emitter and collector, as the case may be).

References herein to a field effect transistor (FET) being "ON" (or a switch being closed) means that the conduction channel of the FET is present, and drain current may flow through the FET. References herein to a FET being "OFF" (or a switch being open) means that the conduction channel is not present, and drain current does not flow through the FET. A FET that is OFF, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within a range of that parameter, such as +/−10 percent of that parameter or +/−5 percent of that parameter.

Modifications are possible in the described examples, and other examples are possible within the scope of the claims.

What is claimed is:

1. A device comprising:

a spatial light modulator including a two-dimensional array of pixels; and a controller coupled to the spatial light modulator and configured to output image data representing an image frame to the spatial light modulator to instruct the spatial light modulator to display the image frame for a frame period, and during the frame period, spatially reposition the image frame on the array of pixels over a plurality of positions, each individual position of the plurality of positions being maintained for a respective time period of respective time periods, wherein the respective time period is selected according to one or more non-negative coefficients of a filter transfer function implemented in an optical domain, wherein the respective time periods sum to a time of the frame period.

2. The device of claim 1, wherein the pixels are diamond pixels, and wherein the filter transfer function is a diamond passband anti-aliasing filter transfer function.

3. The device of claim 2, wherein the diamond passband anti-aliasing filter transfer function is a finite impulse response filter transfer function.

4. The device of claim 3, wherein the finite impulse response filter transfer function is one of a two-by-two finite impulse response filter transfer function or a three-by-three finite impulse response filter transfer function.

5. The device of claim 1, wherein individual coefficients of the filter transfer function specify percentages of the frame period for the respective time periods.

6. The device of claim 1, wherein to spatially reposition the image frame on the array of pixels, the controller is configured to:

output the image data addressed for a first spatial position on the array of pixels;

reformat the image data to address the image data for a second spatial position on the array of pixels; and after a delay period following the output of the image data addressed for the first spatial position, output the image data addressed for the second spatial position on the array of pixels.

7. The device of claim 1, wherein the controller is configured to spatially reposition the image frame on the array of pixels over the plurality of positions at a rate faster than a critical flicker frequency.

8. The device of claim 1, wherein the controller is further configured to:

receive a signal representing the image frame; and apply an electro-optical transfer function to the signal to produce the data representing the image frame.

9. A computer program product comprising one or more non-transitory machine-readable mediums having instructions encoded thereon that when executed by at least one processor cause a method for controlling a device to be carried out, the method comprising:

receiving image data representing an image frame; and outputting the image data to cause the image frame to be displayed on an array of pixels for a frame period, including during the frame period, reformatting the image data to address the image frame for display in a plurality of different spatial positions on the array of pixels, and during the frame period, repositioning at respective time intervals indicated by non-negative coefficients of a filter transfer function implemented in an optical domain, the image frame for display at individual spatial positions of the plurality of different spatial positions, wherein the respective time intervals sum to a time of the frame period.

10. The computer program product of claim 9, wherein the filter transfer function is a finite impulse response diamond passband anti-aliasing filter transfer function.

11. The computer program product of claim 10, wherein the filter transfer function is one of a two-by-two finite impulse response filter transfer function or a three-by-three finite impulse response filter transfer function.

12. The computer program product of claim 9, wherein repositioning the image frame for display at the individual spatial positions of the plurality of different spatial positions comprises, for each respective time interval:

outputting the image data; and providing a control signal to cause display of the image frame at the respective spatial position on the array of pixels for a time period specified by a corresponding coefficient of the filter transfer function.

13. The computer program product of claim 9, wherein repositioning the image frame for display at the individual spatial positions comprises outputting the image data at a rate faster than a critical flicker frequency.

14. A projection system comprising:

a spatial light modulator including a two-dimensional array of pixels;

a light source configured to illuminate the spatial light modulator; and a controller coupled to the spatial light modulator and configured to write image data representing an image frame to the spatial light modulator to control the spatial light modulator to project the image frame, based on the image data and light received from the light source, for a frame period, and during the frame period, cause the image frame to be spatially repositioned on the array of pixels over a plurality of positions according to a filter transfer function having non-negative coefficients, wherein the filter transfer function is implemented in an optical domain, each non-negative coefficient represents a percentage, of percentages, of the frame period for which an individual position of the plurality of positions is maintained, and the percentages sum to 100% of the frame period.

15. The projection system of claim 14, wherein the spatial light modulator is a digital micromirror device.

16. The projection system of claim 14, wherein the pixels are diamond pixels, and wherein the filter transfer function is an anti-aliasing finite impulse response filter transfer function.

17. The projection system of claim 14, wherein the controller is configured to cause the image frame to be spatially repositioned over the plurality of positions at a rate faster than a critical flicker frequency.

18. The projection system of claim 14, further comprising:

a display element configured to display the image projected by the spatial light modulator.

19. The projection system of claim 18, wherein the display element comprises a head-up display for a vehicle.

20. The projection system of claim 18, wherein the display element comprises a liquid crystal display.

* * * * *